US007435612B2

(12) United States Patent
Xiao et al.

(10) Patent No.: US 7,435,612 B2
(45) Date of Patent: Oct. 14, 2008

(54) CMOS-MEMS PROCESS

(75) Inventors: Fu-Yuan Xiao, Lu-Chou (TW); Ying-Zong Juang, Tainan (TW); Chin-Fong Chiu, Hsin-Chu (TW)

(73) Assignee: National Applied Research Laboratories National Chip Implementation Center, Hsinchu (TW)

( * ) Notice: Subject to any disclaimer, the term of this patent is extended or adjusted under 35 U.S.C. 154(b) by 347 days.

(21) Appl. No.: 11/270,523

(22) Filed: Nov. 10, 2005

(65) Prior Publication Data

US 2006/0105543 A1 May 18, 2006

Related U.S. Application Data

(60) Provisional application No. 60/626,923, filed on Nov. 12, 2004.

(51) Int. Cl.
*H01L 21/00* (2006.01)

(52) U.S. Cl. .................. 438/50; 438/52; 257/E21.613; 257/E29.324

(58) Field of Classification Search .................. 438/52, 438/53, 706, 50
See application file for complete search history.

(56) References Cited

U.S. PATENT DOCUMENTS 7,012,322 B2 * 3/2006 Ridley et al. ................ 257/673
7,026,247 B2 * 4/2006 Dokumaci et al. .......... 438/705

* cited by examiner

*Primary Examiner*—Quoc D Hoang
(74) *Attorney, Agent, or Firm*—Rosenberg, Klein & Lee

(57) ABSTRACT

A fully CMOS compatible MEMS multi-project wafer process comprises coating a layer of thick photoresist on a wafer surface, patterning the photoresist to define a micromachining region, and performing a micromachining in the micromachining region to form suspended microstructures.

9 Claims, 9 Drawing Sheets

240
290
320
230
260
232
234
236
222
310
260
250
250
FOX
310
220
250
P Well
250
220
250
250
N Well
210
Silicon Substrate

| | Before post process (CMOS) | After post process (CMOS-MEMS) |
|---|---|---|
| S11 | -10.953dB | -10.866dB |
| VSWR | 1.79 | 1.80 |
| S21 | 6.624dB | 6.874dB |
| $P_{-1dB}$ | -8.7dBm | -9.2dBm |
| IIP3 | 5.2dBm | 4.85dBm |
| OIP3 | 10dBm | 10dBm |
| NF | 5.61dB | 5.69dB |
| Power | 21.14mW | 21.38mW |

Fig. 10

CMOS-MEMS PROCESS

REFERENCE TO RELATED APPLICATIONS

This Application is based upon Provisional Application Ser. No. 60/626,923, filed 12 Nov. 2004.

FIELD OF THE INVENTION

The present invention is generally related to a complementary metal-oxide-semiconductor (CMOS) microelectromechanical system (MEMS) process and, more particularly, to a fully CMOS compatible MEMS multi-project wafer process.

BACKGROUND OF THE INVENTION

Surface and bulk micromachining technologies combined with the existing integrated circuit (IC) technologies have more and more potential to serve as a system-on-chip (SoC) design platform. New ideas can be rapidly implemented through the mature foundry service without worrying about the process complexity. High-aspect-rate CMOS-MEMS process was first reported by G. K. Fedder et al., Proc. MEMS '96, pp. 13-18, 1996. Top metal layer in this technology acts as a hard mask while performing post etching process. Up to now, it has been applied to make mechanical filter, accelerometers, gyroscopes, optical modulators, and radio frequency (RF) passive devices. However, there are many drawbacks in the previous COMS-MEMS process, for examples, input/output (I/O) pads including electrostatic discharge (ESD) circuits are destroyed by ion bombardment, CMOS transistors are damaged if there is no metal layer above them, a floating metal layer induces more parasitics and is not allowed especially in RF circuits, CMOS passivation layer is removed and thus moisture and dust can easily deteriorate circuit performance, and the top metal layer in CMOS process can not be used as interconnects or passive devices but serves as a hard mask for post dry etching process instead. Furthermore, there has not proposed evidence to show if thermal cycling effect existing in the post dry etching process does not influence the circuit performance.

Therefore, it is desired an improved process flow that can solve the above-mentioned problems and is fully CMOS compatible.

SUMMARY OF THE INVENTION

An object of the present invention is to provide a fully CMOS compatible MEMS process.

In a process, according to the present invention, a layer of thick photoresist (PR) is coated on a wafer and patterned to define a micromachining region after a standard CMOS process, and performing a micromachining step in the micromachining region to form suspended microstructures thereof.

From an aspect of the present invention, PR is used to replace the metal layer as a mask in post etching process, avoiding the drawbacks of device performance deterioration and structure damages resulted from the metal layer mask in conventional process. Furthermore, a process of the present invention is fully compatible with standard CMOS process, and it is thus performed without changing the production line in CMOS foundries, thereby increasing the process flexibility and decreasing the cost therefor.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which:

FIG. 10 summarizes the circuit performance of a 5.8 GHz LNA before and after post process.

DETAILED DESCRIPTION OF THE INVENTION

Figure 1:
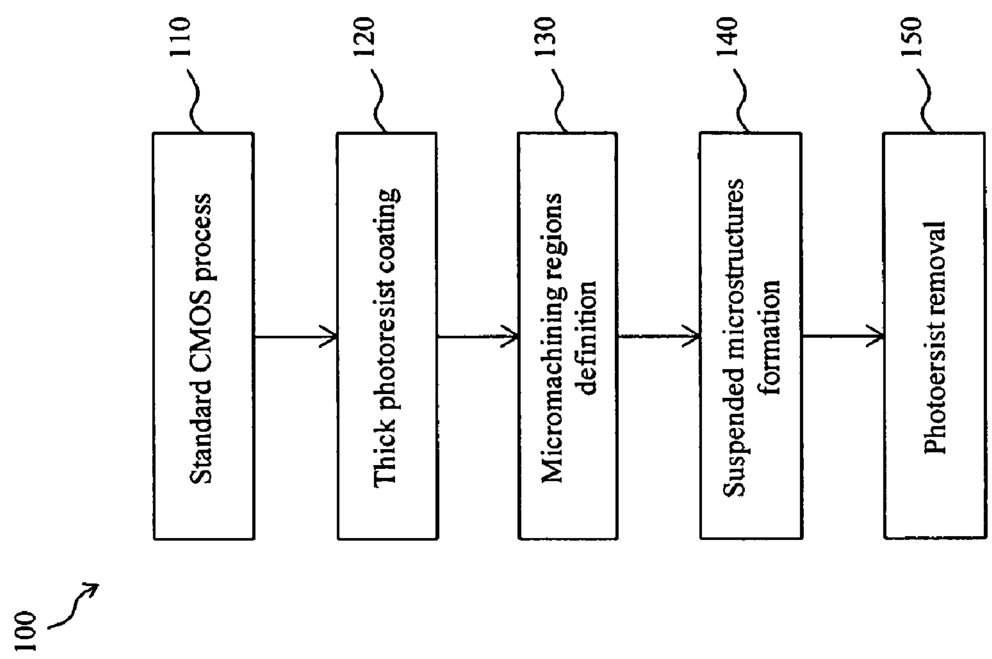
FIG. 1 is a flowchart of a CMOS-MEMS process according to the present invention.
Figure 2:
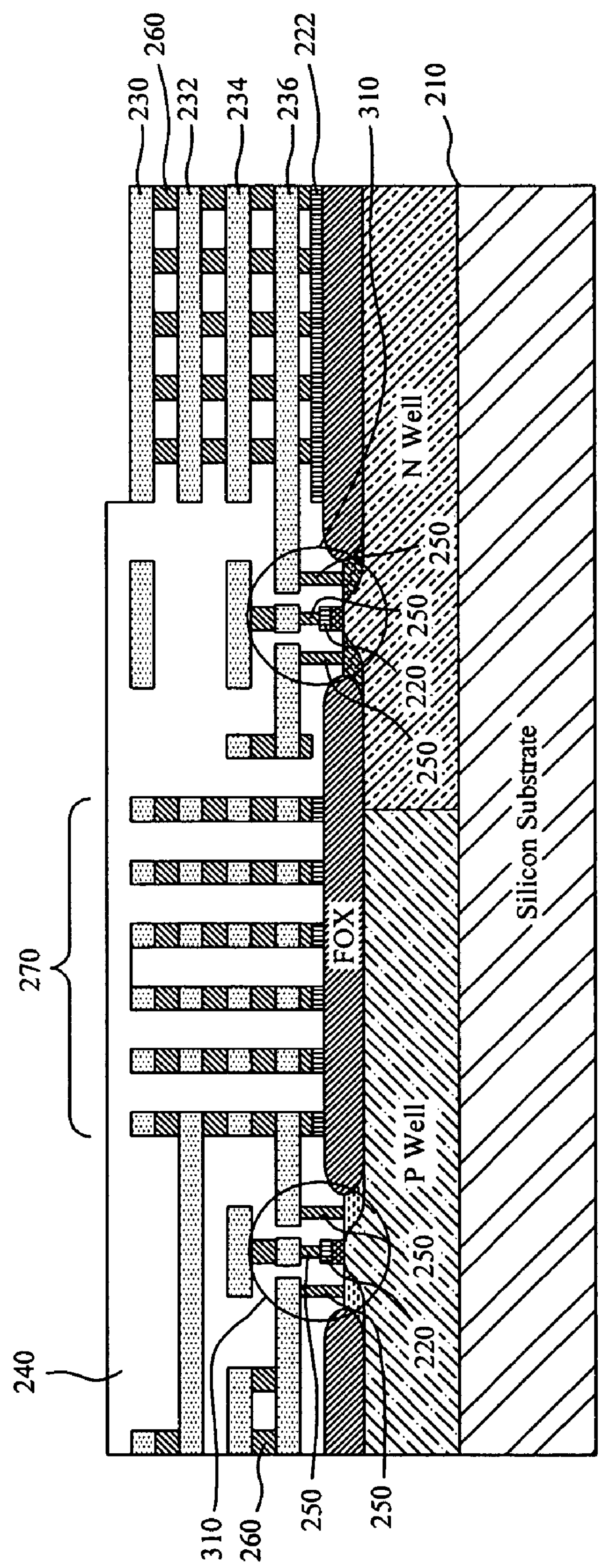
FIGS. 2 to 4 show the cross-sectional view of CMOS-MEMS microstructures during the production by the flowchart of FIG. 1.

FIG. 1 shows a flowchart 100 of a CMOS-MEMS process according to the present invention. It starts with 0.35 μm double-poly quadruple-metal (2P4M) CMOS polycide process. After a standard CMOS process in step 110, as shown in FIG. 2, electronic circuits 310 and microstructures 270 are formed on a substrate 210. The microstructures 270 of MEMS components consist of polysilicon 222, metal layers 230, 232, 234 and 236, and dielectrics 240. The electronic circuits 310 include active devices and their corresponding contacts 250, vias 260 and interconnections 234 and 236. The first polysilicon layer 220 for forming the electronic circuits 310 can not interconnect to the second polysilicon layer 222. The contact holes between the metal layer 236 and the sources, drains and gates of the active devices, and the via holes between the multiple metallization layers 230-236, are filled with tungsten plugs to form the contacts 250 and vias 260. The multiple metallization layers 230-236 are made of aluminum. Multilevel interconnect process involves chemical mechanical polishing (CMP) to achieve plane surfaces. Dielectrics 240 refer to oxide except for the passivation layer which includes nitride and oxide. All the polysilicon layers 220 and 222, and metal layers 230-236 are replaced by oxide with equal thickness if they are not used in the microstructures 270. In step 120, a layer of thick PR is coated on the wafer surface and therefore covers on the metal layer 230 and dielectric layer 240, including over the microstructures 270.

Figure 3:
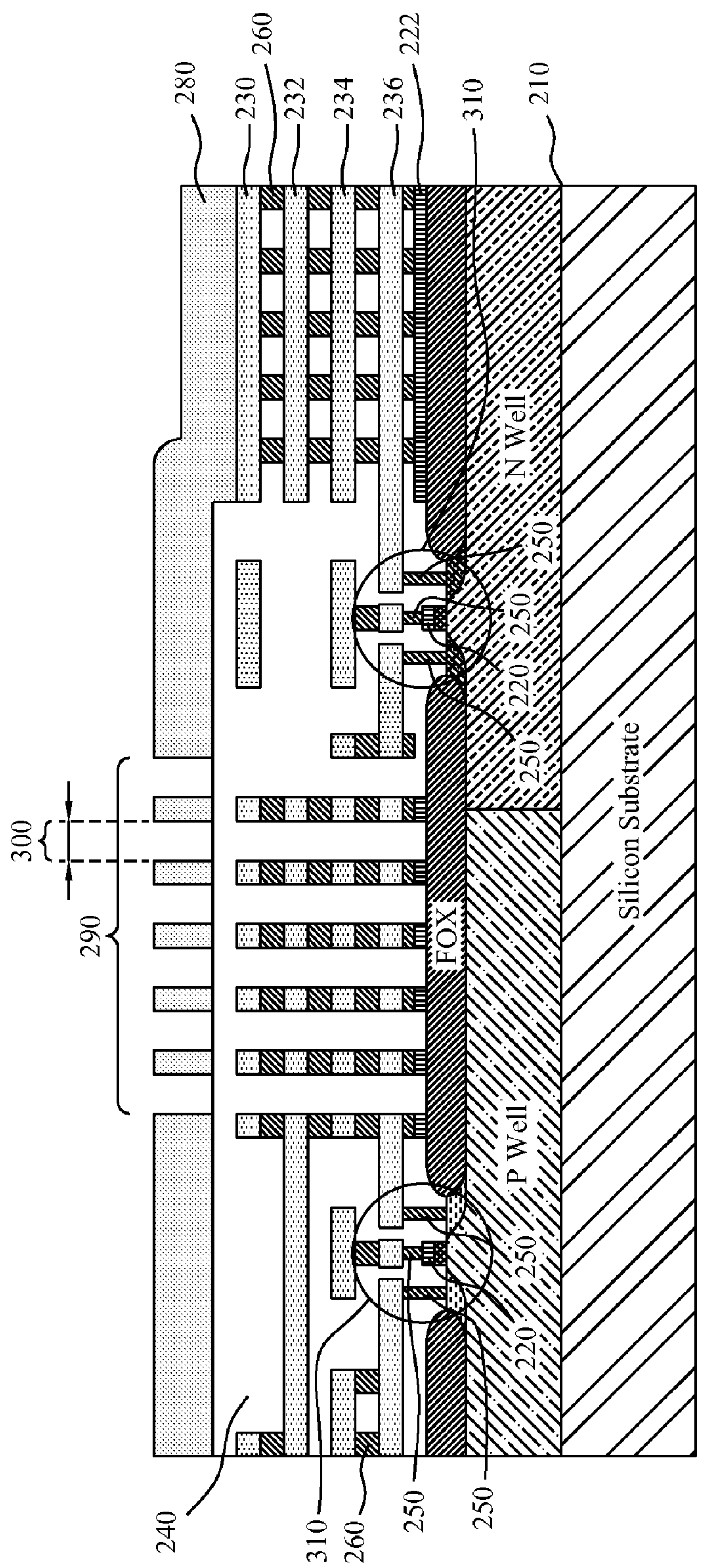
Figure 4:
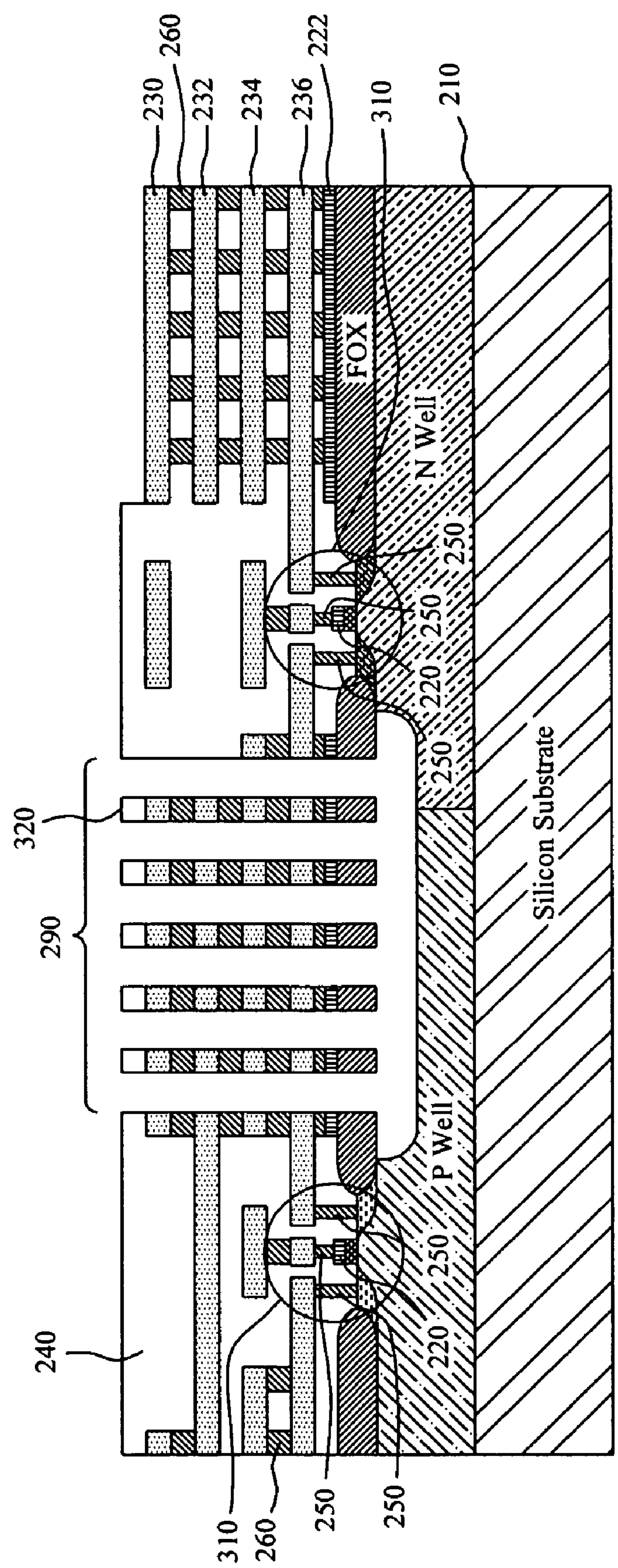

Then, in step 130, the photoresist (PR) 280 is patterned to define a release (RLS) region constituting a hard mask (RLS mask) to protect the MEMS components and electronic circuits in the following dry etching process. As shown in FIG. 3, the patterned PR 280 is also used to define micromachining region 290 in the RLS region which functions as the RLS mask. Polysilicon and metal are not allowed in RLS regions 300 formed between the lines of the RLS mask. The RLS region (RLS mask) is formed with a plurality of patterned lines, separated each from the other a pre-determined distance (line width) 300 to define the size 320 of suspended microstructures as shown in FIGS. 3-4. The minimum and maximum line widths of RLS are 4 μm and 10 μm, respectively, in this embodiment. The former is constrained by the thickness of the dielectric layer 240 and the latter is constrained by the selectivity of the PR 280 versus the dielectric 240. The ratio of the suspended structural width and line width of RLS is no greater than one.

In step 140, all the microstructures defined by RLS are released by a micromachining step, including dielectric trench etching and silicon undercutting. It includes using the patterned PR 280 as a hard mask for the post etching process to release all the microstructures in the micromachining region 290 by trench etching and substrate undercutting. In this step, the PR 280 protects the MEMS devices components and electronic circuits from the post etching process. In step 150, the hard mask PR 280 is removed to complete this CMOS-MEMS process. As shown in FIG. 4, suspended microstructures 320 are formed above the silicon substrate 210. The distance between the micromachining region 290 and nearby active devices is greater than 20 μm.

Figure 5:
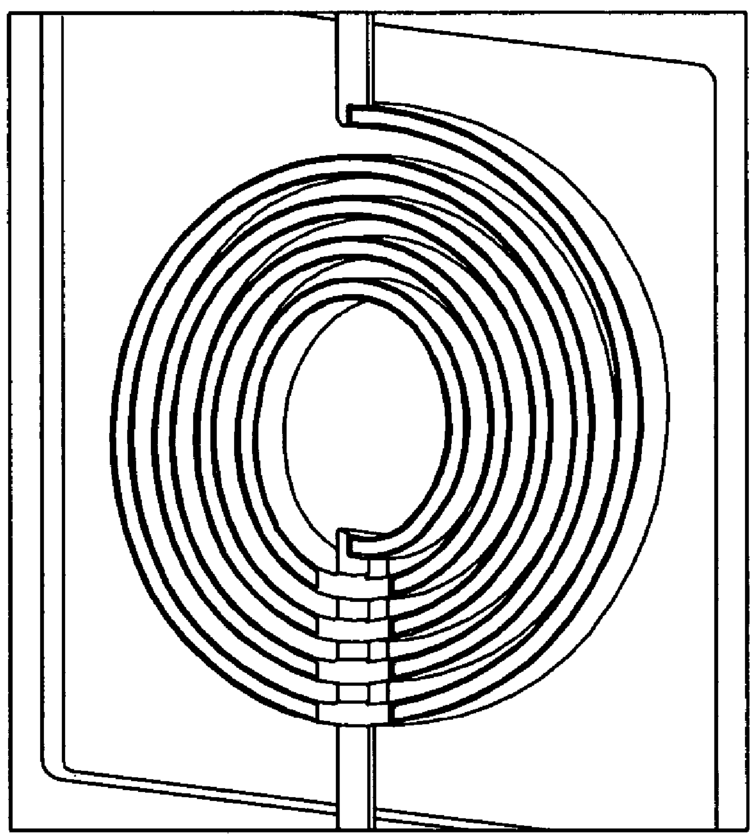
FIG. 5 shows a micromachined RF inductor suspended over the substrate.
Figure 6:
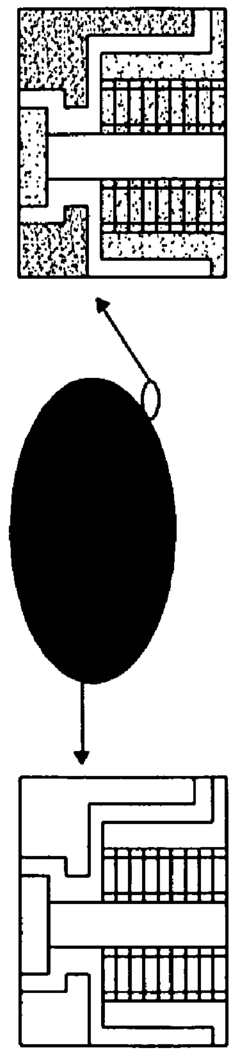
FIG. 6 is a diagram showing that the PR is over burned around the wafer edge.
Figure 7:
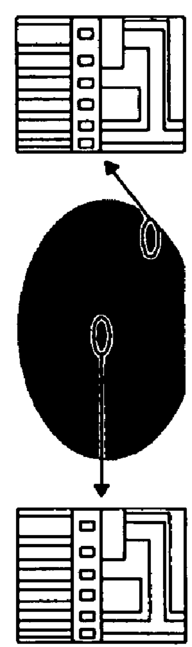
FIG. 7 is a diagram showing that the burned PR is removed after tuning the post process.

FIG. 5 shows a micromachined RF inductor suspended over the substrate that is produced by the process 100 of FIG. 1, and in this embodiment, the dielectric thickness is about 8 μm and the total etching depth is about 10 μm in post etching process. In this case, the dielectric trench etching is divided into several times in order to lower the substrate temperature and therefore, the substrate constantly suffers from thermal cycling effect until the post process terminates. Dividing the dielectric trench etching into several cycles when the dielectric is much thick may avoid the hard mask RP over burned by highly heated substrate or long-period ion bombardment. As shown in FIG. 6, the PR around the substrate edge (about 10 mm to 15 mm) is over burned in the post etching process and the burned PR will permanently remain on the substrate, and as shown in FIG. 7, this phenomenon is alleviated by optimizing the process parameters following the above process.

Figure 8:
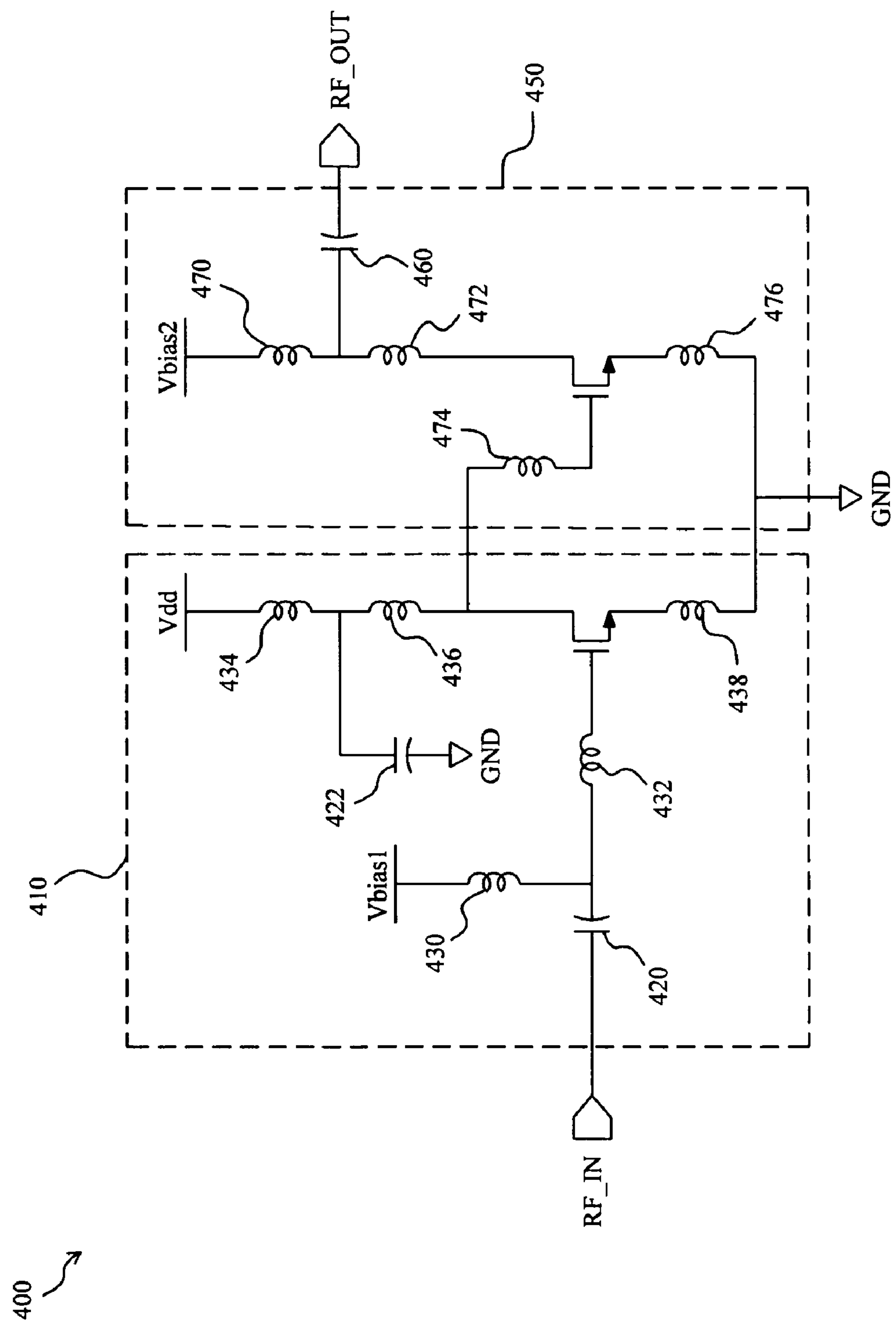
FIG. 8 shows a schematic view of an LNA to verify the thermal cycling effect.
Figure 9:
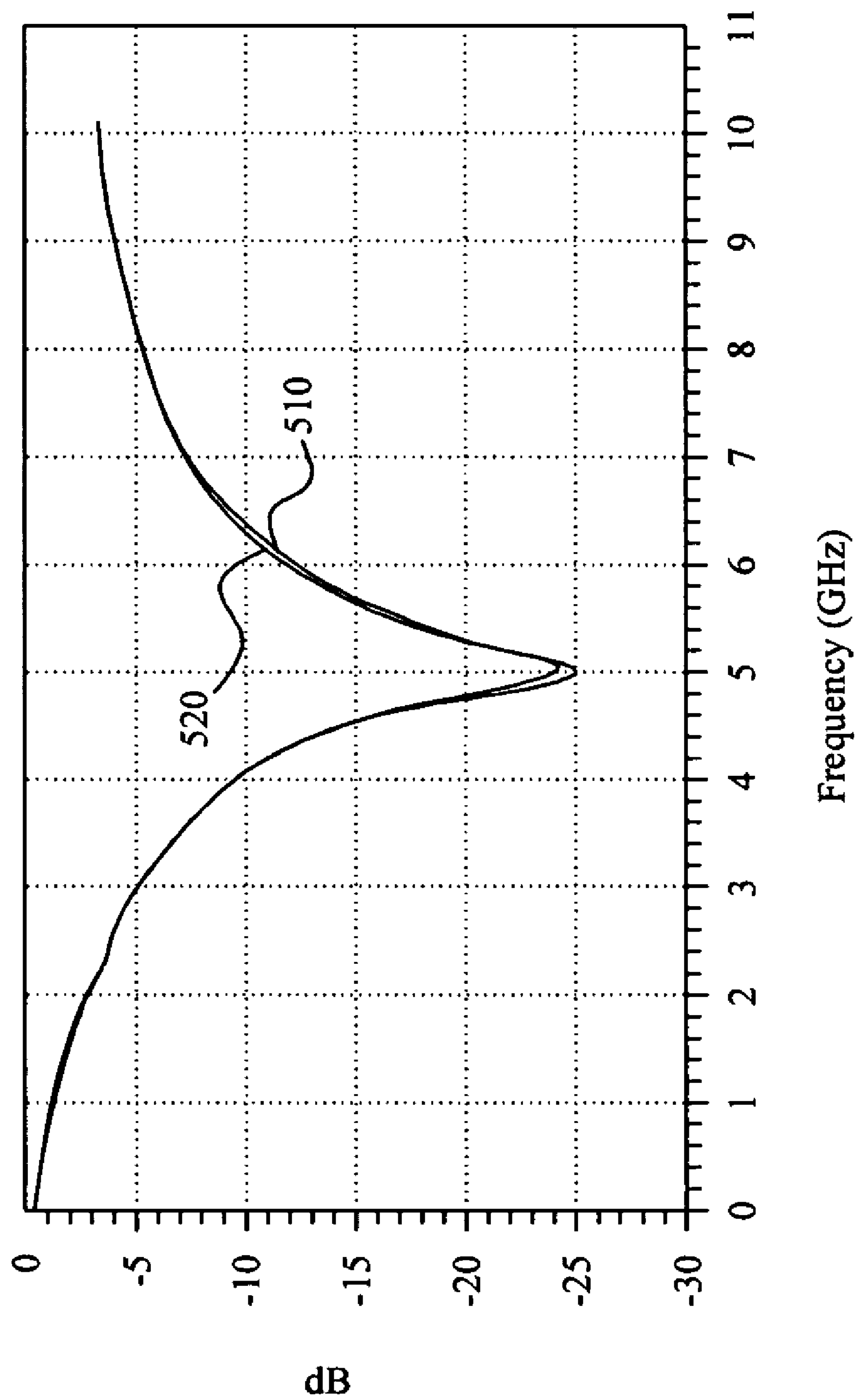
FIG. 9 shows the measured S22 of a 5.8 GHz LNA before and after post process.

Since the thermal cycling effect is inevitable, the influence on circuit performance is further evaluated. To verify it, a 5.8 GHz low noise amplifier (LNA) is designed and measured results are compared before and after the improved post process. As shown in FIG. 8, the LNA 400 architecture comprises two-stage common-source amplifier with inductive degeneration. The gate inductor 432 and source inductor 438 of the first stage 410 are chosen to provide the desired input resistance (50 Ω) at resonance. The drain inductor 436 of the first stage 410 acts as load to increase the gain at high frequency and adjust the central frequency. The gate inductor 474 and source inductor 476 of the second stage 450 function as inter-stage impedance matching and circuit stability. The output impedance matches to 50 Ωby the drain inductor 472 of the second stage 450. Other inductors 430, 434 and 470 and capacitors 420, 422 and 460 serve as the simulated parasitic effect. The operating frequency of the LNA 400 is 5.8 GHz, the total current is 15 mA, the supply voltage is 1.3 V, and consequently the power consumption is 20 mW. Simulation results of scattering parameters at 5.8 GHz indicate that return loss (S11) is −12.7 dB, stability (S22) is −10.1 dB, and gain (S21) is 10.3 dB. The measured S22 is shown in FIG. 9, in which curve 510 is after post process and curve 420 is before post process. It is clear shown that the S22 measured before post process agrees with measured after post process from 0 to 10 GHz. The measured results of circuit performance of the 5.8 GHz LNA 400, including S11, S21, noise figure (NF) from 3 GHz to 10 GHz, voltage standing wave ratio (VSWR), 1 dB gain compression point (P-1 dB), input and output third-order intercept point (IIP3 and OIP3), and power dissipation are summarized in FIG. 10. The parameters measured before and after post process match well with each other from 0 to 10 GHz and no additional noise source is generated in the LNA 400 after post process. Although the thermal cycling effect exists, the peripheral circuit still survives and keeps the same performance. It demonstrates that that this post process is fully compatible with CMOS process.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A CMOS-MEMS process comprising the steps of:

fabricating at least one microstructure on a wafer surface;

coating a dielectric layer on said wafer surface having said at least one microstructure formed by a standard CMOS process thereon, said dielectric layer covering said at least one microstructure;

coating a photoresist layer on said dielectric layer;

patterning the photoresist layer for defining a micromachining region containing said at least one microstructure priorly fabricated;

performing a micromachining through said patterned photoresist layer and said dielectric layer to suspend said at least one microstructure in the micromachining region by using the patterned photoresist a hard mask; and removing the photoresist.

2. The process of claim 1, wherein the step of patterning the photoresist comprises the step of defining a released (RLS) region, said RLS region constituting a RLS mask formed in said photoresist for creating said suspended at least one microstructure, said RLS region including a plurality of lines separated each from the other a specific line width.

3. The process of claim 2, wherein a width of said suspended at least one microstructure and said line width on the RLS region have a ratio not greater than one.

4. The process of claim 2, wherein the RLS region has said line width in the range between 4 μm and 10 μm.

5. The process of claim 1, wherein the micromachining region has a distance apart from a nearby active device greater than 20 μm.

6. The process of claim 1, wherein the micromachining comprises etching process.

7. The process of claim 6, wherein the etching process comprises a dry etching.

8. The process of claim 6, wherein the etching process comprises a trench etching and a substrate undercutting.

9. The process of claim 8, wherein the trench etching includes several cycles for avoiding the photoresist over burned.

* * * * *